(12) United States Patent
Lindsay

(10) Patent No.: US 10,892,614 B2
(45) Date of Patent: Jan. 12, 2021

(54) SAFETY DEVICE FOR A POWER SUPPLY

(71) Applicant: Neil Lindsay, Congewai (AU)

(72) Inventor: Neil Lindsay, Congewai (AU)

( * ) Notice: Subject to any disclaimer, the term of this patent is extended or adjusted under 35 U.S.C. 154(b) by 318 days.

(21) Appl. No.: 15/779,506

(22) PCT Filed: Dec. 1, 2016

(86) PCT No.: PCT/AU2016/051182
§ 371 (c)(1),
(2) Date: May 25, 2018

(87) PCT Pub. No.: WO2017/091861
PCT Pub. Date: Jun. 8, 2017

(65) Prior Publication Data
US 2018/0351347 A1    Dec. 6, 2018

(30) Foreign Application Priority Data

Dec. 1, 2015 (AU) .................................. 2015904981

(51) Int. Cl.
*H02H 5/10*    (2006.01)
*H02H 3/33*    (2006.01)
*G01R 31/50*   (2020.01)
*G01R 31/67*   (2020.01)
(Continued)

(52) U.S. Cl.
CPC ............. *H02H 5/105* (2013.01); *G01R 31/50* (2020.01); *G01R 31/67* (2020.01); *H02H 3/335* (2013.01);
(Continued)

(58) Field of Classification Search
CPC ............ H02H 5/00; H02H 5/10; H02H 5/105; H02H 11/00; H02H 11/001; H02H 11/002;
(Continued)

(56) References Cited

U.S. PATENT DOCUMENTS 4,298,864 A * 11/1981 Mahnke ........... G01R 19/16571
340/649
7,292,419 B1    11/2007 Nemir
(Continued)

OTHER PUBLICATIONS

AD4C101 Datasheet, "Dual 1 Form a Solid State Relay", Solid State Optronics, 2009, pp. 1-5. (Year: 2009).*
(Continued)

*Primary Examiner* — Thienvu V Tran
*Assistant Examiner* — Carlos O Rivera-Perez

(57) ABSTRACT

Safety device for an electrical apparatus powered by an AC mains power supply, the safety device comprising: an electric circuit having inputs for connecting to an active, neutral and earth conductors of the electrical apparatus which are in turn coupled to the AC mains power supply, the circuit being operable to: produce and apply a stepped down voltage and current to the earth conductor from the main supply; and electrically isolate the active and neutral conductors from the earth conductor in response to detecting that either: the active conductor is incorrectly wired to the neutral circuit of the AC mains power supply; the neutral conductor is incorrectly wired to the active circuit of the AC mains power supply; or the neutral conductor is switched; wherein one or more solid state relays are employed by the circuit for both producing the stepped down voltage and electrically isolating the conductors from earth.

13 Claims, 5 Drawing Sheets

(51) Int. Cl.
　　　*H02H 9/02*　　　(2006.01)
　　　*H02H 11/00*　　(2006.01)
　　　*G01R 31/69*　　(2020.01)
　　　*H02H 3/04*　　　(2006.01)
(52) U.S. Cl.
　　　CPC .............. *H02H 3/338* (2013.01); *H02H 9/02* (2013.01); *H02H 11/002* (2013.01); *G01R 31/69* (2020.01); *H02H 3/04* (2013.01)
(58) Field of Classification Search
　　　CPC .......... H02H 11/003; H02H 9/00; H02H 9/02; H02H 3/00; H02H 3/04; H02H 3/044; H02H 3/331; H02H 3/335; H02H 3/338; H02H 3/14; G01R 31/50; G01R 31/54; G01R 31/55; G01R 31/58; G01R 31/66; G01R 31/67; G01R 31/68; G01R 31/69
　　　USPC ........ 361/1, 42–50; 324/508, 538, 543, 555, 324/556
　　　See application file for complete search history.

(56) References Cited

U.S. PATENT DOCUMENTS

| | | |
|---|---|---|
| 2003/0169052 A1 | 9/2003 | Yamada et al. |
| 2004/0246003 A1 | 12/2004 | Bryndzia et al. |
| 2007/0188955 A1 | 8/2007 | Elms |
| 2009/0160663 A1 | 6/2009 | Silverman et al. |

OTHER PUBLICATIONS

International Preliminary Report on Patentability from PCT Application No. PCT/AU2016/051182 (filed Dec. 1, 2016), dated Jun. 15, 2017.
International Search Report and Written Opinion from PCT Application No. PCT/AU2016/051182 (filed Dec. 1, 2016), dated Feb. 23, 2017.
Extended European Search Report from European Application No. 16869413.1, dated Jan. 24, 2020.

* cited by examiner

SAFETY DEVICE FOR A POWER SUPPLY

FIELD OF THE INVENTION

The present invention relates generally to a safety device for an electrical apparatus, power supply or power outlet and more particularly, but by no means exclusively, to a device for providing an indication that an incoming power supply is tested to have the active power wire in the correct position and there is a return path connected to the earth and neutral connections.

BACKGROUND OF THE INVENTION

Particular care needs to be taken when dealing with power supplies and outlets, such as power points, power boards and the like. For example, electrocution can readily occur if the outlet or supply is connected to a non-functioning earth path.

Currently, manufacturers of electric equipment generally assume that a functional earth path exists for their circuitry. Thus, circuits are often deliberately referenced to earth. As persons skilled in the art will appreciate, such referencing creates an instant above earth potential (e.g. to metal framework) when a disruption to the main supply earth occurs. This is magnified if the main earth path is open and an earth fault current derives from a faulty item.

SUMMARY OF THE INVENTION

In accordance with a first aspect of the present invention there is provided a safety device for an electrical apparatus powered by an AC mains power supply, the safety device comprising:

an electric circuit having inputs for connecting to an active, neutral and earth conductors of the electrical apparatus which are in turn coupled to the AC mains power supply, the circuit being operable to:

produce and apply a stepped down voltage and current to the earth conductor from the main supply; and electrically isolate the active and neutral conductors from the earth conductor in response to detecting that either:

(a) the active conductor is incorrectly wired to the neutral circuit of the AC mains power supply and the neutral conductor is incorrectly wired to the active circuit of the AC mains power supply; or (b) the neutral conductor is switched; and wherein one or more solid state relays are employed by the circuit for both producing the stepped down voltage and electrically isolating the conductors from earth.

In an embodiment the electric circuit further comprises an indicator that is configured to output a visual indication of a state of the earth return path.

In an embodiment the indicator is configured to emit a signal when there is a connected earth return path.

In an embodiment the electric circuit comprises a switch that causes the indicator to switch off in the event of an open circuit return path.

In an embodiment the switch comprises a transistor having a base connected to the active terminal and wherein the collector and emitter of the transistor are electrically connected respective terminals of an LED operable to provide the visible indicator.

In an embodiment the electric circuit is integrated into the electrical apparatus, such that the visible indication is visible externally of the housing.

In an embodiment wherein the stepped down voltage and current is of a level such that it is not detectable by human touch.

In an embodiment the stepped down voltage and current is of a level such that it does not interfere with mains protection monitoring devices or periodic testing equipment.

In an embodiment the SSR(s) are miniature SSR(s) employing opto-coupler switching.

In an embodiment the circuit comprises either a pair of SSRs or a double pole SSR and wherein the active and neutral conductors are connected via the pair/poles of the SSRs such that the switches thereof are only operable to switch on when the active and neutral conductors are wired to the correct terminals on the AC mains power supply.

In an embodiment the SSRs comprise first and second phototransistor optocouplers.

In an embodiment an anode of the first optocoupler is electrically connected to the active conductor; a collector of the first optocoupler is electrically connected to the active conductor; a cathode of the first optocoupler is electrically connected to an anode of the second optocoupler; an emitter of the first optocoupler is electrically connected to a collector of a first transistor and whereby a base of the first transistor is electrically connected between the active conductor and the anode of the first optocoupler; a collector of the second optocoupler is electrically connected to the emitter of the first transistor; a cathode of the second optocoupler is electrically connected to the ground terminal; and an emitter of the second optocoupler is electrically connected to the neutral conductor.

In an embodiment the circuit further comprises a test mechanism for testing whether the safety device is capable of detecting (a) or (b). The cathode of the first optocoupler and the anode of the second optocoupler and connected by way of a normally closed magnetically controlled switch and wherein the safety device can be tested by placing a magnet in proximity to the switch such that absence of the visual indicator indicates that the safety device is operational.

In accordance with a second aspect there is provided an AC mains powered device comprising a safety device as described above.

In an embodiment the safety device is located within a housing and electrically coupled to circuitry within the mains powered device that facilitates its operation.

In accordance with a third aspect there is provided a safety device for an AC mains power supply, the safety device comprising:

an electric circuit having inputs for connecting to an active, neutral and earth conductors of the AC mains power supply, the circuit being operable to:

produce and apply a stepped down voltage and current to the earth conductor from the AC mains power supply; and electrically isolate the active and neutral conductors from the earth conductor in response to detecting that either:

(a) the active conductor is incorrectly wired to the neutral circuit of the AC mains power supply and the neutral conductor is incorrectly wired to the active circuit of the AC mains power supply; or (b) the neutral conductor is switched; and wherein one or more solid state relays are employed by the circuit for both producing the stepped down voltage and electrically isolating the conductors from earth.

In an embodiment the device further comprises a body for at least partially housing the circuit and wherein the body includes at least one of:

a set of pins electrically connected to the respective inputs of the circuit, the pins being suitably configured for connecting to a power outlet which is in turn connected to the power supply; and a set of sockets electrically connected to the respective inputs of the circuit, the sockets being suitably configured for receiving a plug which is in turn connected to the power supply.

In an embodiment the circuit further comprises an indicator which is configured to emit a visible signal when there is a connected earth return path and wherein the signal is visible from outside of the body.

In accordance with a fourth aspect there is provided a male or female plug of an electrical power lead, comprising the safety device as afore described in accordance with the third aspect; and a light emitting device disposed on or in the body of the plug and operable to emit the signal.

In accordance with a fifth aspect there is provided a power board, comprising the safety device as afore described in accordance with the third aspect; and a light emitting device disposed on or in the body of the board and operable to emit the signal.

In accordance with a sixth aspect there is provided a residual current device, comprising the safety device as afore described in accordance with the third aspect, wherein the earth input is operable to connect to a grounding framework for the residual current device; and a light emitting device disposed on or in the body of the residual current device and operable to emit the signal.

In an embodiment the circuit if further configured to trip the residual current device when there is no operation earth path detected.

In accordance with a seventh aspect of the invention there is provided a safety device for a power supply, comprising: an electric circuit having inputs for electrical connection to an active, neutral and earth conductor of the power supply, the circuit being operable to produce and supply a stepped down voltage and current of predetermined value to the earth conductor, and output a signal when there is an operational earth path detected by the circuit and wherein the stepped down voltage and current is achieved utilising a solid state relay (SSR).

In an embodiment the circuit is configured to output the signal when a resistance for the earth path is less than a predetermined minimum resistance.

In an embodiment the circuit comprises a light emitting device (LED) and wherein the LED is operable to output the signal.

In an embodiment the circuit is configured such that the LED is only operational when the earth path resistance is less than the predefined minimum resistance.

BRIEF DESCRIPTION OF THE
ACCOMPANYING DRAWINGS

Embodiments of the present invention will now be described, by way of example only, with reference to the accompanying drawings, in which.

DETAILED DESCRIPTION

Embodiments of the invention will hereafter be described in the context of a safety device and/or step down circuit suitable for use with a standard Australian 240V AC 50 Hz power supply. It will be understood, however, that embodiments are not so limited and that the safety device and circuit described herein could be configured for use with power supplies of different voltage and current values for any desired jurisdiction.

Figure 1:
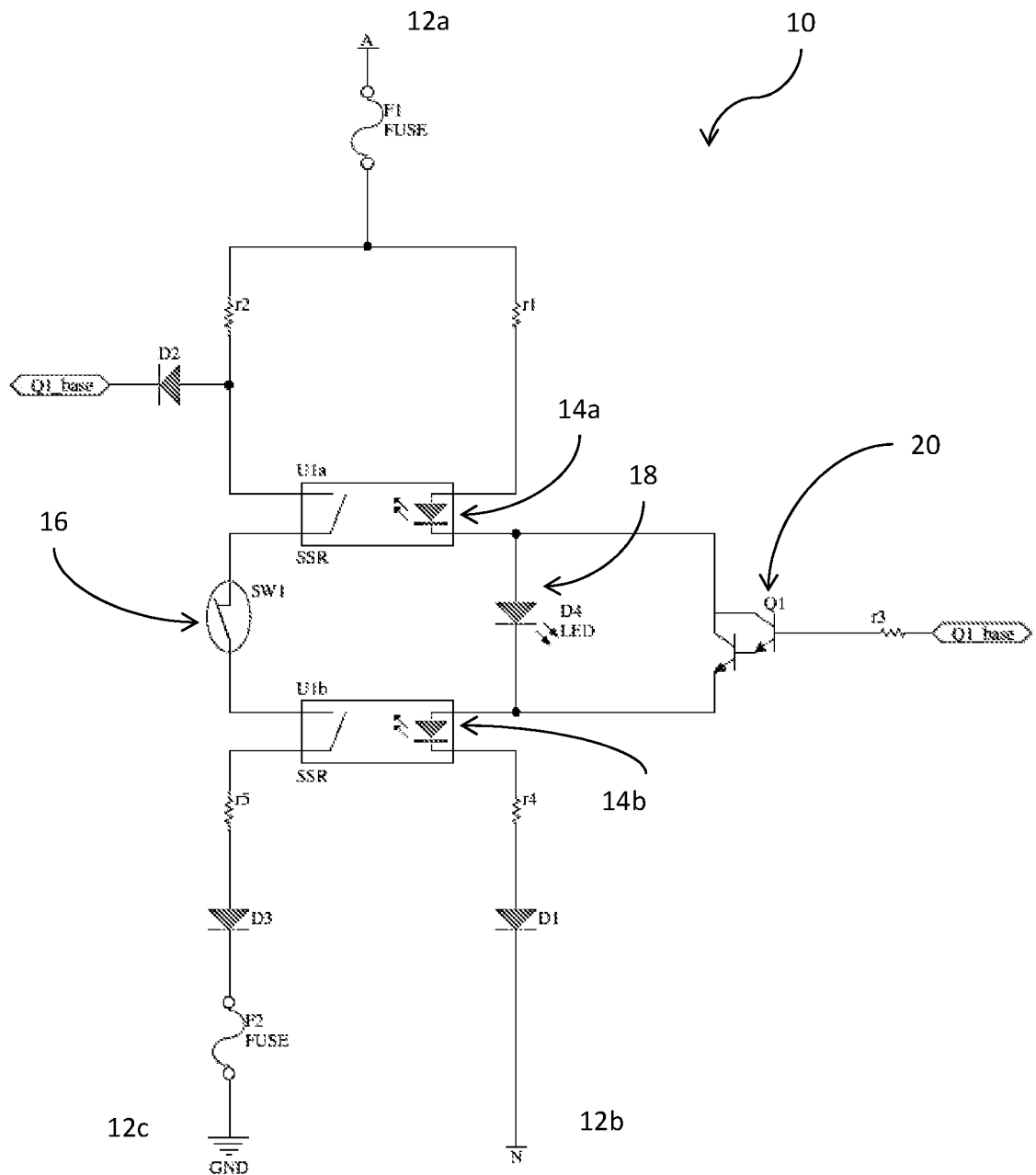
FIG. 1 is a circuit diagram for a safety device circuit, in accordance with an embodiment of the present invention.

With reference to FIG. 1 there is shown a circuit diagram of a sub-miniature electric circuit 10 in accordance with an embodiment of the present invention. In a particular embodiment, the circuit 10 is implemented as an integrated component of an AC mains powered apparatus (hereafter "appliance"). As shown, the circuit 10 has inputs 12a to 12c for electrical connection to active, neutral and earth conductors, respectively, of the mains powered appliance (not shown). The circuit 10 is advantageously operable to continuously monitor the supplied "in use" power to provide an indication that the appliance is correctly wired to an active, neutral and earth of the mains power supply. If a wiring fault is detected, the circuit 10 immediately isolates the active and neutral conductors from the earth to ensure that the full mains voltage remains isolated (which has the potential to cause electrocution), with a suitable indication provided to user (e.g. the presence or absence of a light, alarm, or other suitable indication). According to embodiments described herein, the wiring fault may be that either the active conductor is incorrectly wired to the neutral of the power supply (or vice versa that the neutral conductor is incorrectly wired to the active of the supply), that the neutral wire is switched, or that there is no connected earth path.

In more detail, the circuit 10 employs a pair of miniature solid state relays 14a, 14b (SSRs), a switch 16 (SW1), light emitting diode 18 (D4), bipolar transistor 20 (Q1) and various other circuit components (that will be described in more detail in subsequent paragraphs). An advantage of the illustrated circuit 10 is that all the components are miniature in size, therefore allowing it to be integrated into all manner of appliances.

According to the illustrated embodiment, the SSRs 14a, 14b each take the form of a 4-pin phototransistor opto-isolator. It will be understood that in an alternative embodiment, a dual pole opto-isolator could be used in place of the pair. The function of the isolators 14a, 14b is two-fold, as will now be described.

Isolating Active and Neutral Through Incorrect Wiring

An important function of the isolators 14a, 14b is that they operate to electrically isolate the active and neutral inputs from earth in response to detecting one of the following conditions: (a) that the active conductor 12a is incorrectly wired to the neutral of the mains supply and vice versa that the neutral conductor 12b is incorrectly wired to the active of the mains supply; or (b) that the that neutral conductor 12b is connected downstream to a switch (i.e. is "switched"). As will be evident from the circuit diagram of FIG. 1, if the active conductor 12a and neutral conductor 12b are incorrectly wired, the isolators 14a, 14b will cease to operate, thereby isolating the active input from the earth conductor 12c. The same applies where the neutral conductor 12b is connected downstream to a switch, in which case the isolator 12*b* will see an open circuit and therefore power off, isolating the active conductor 12*a* (and thus the mains voltage) from the earth.

Monitoring for an Operational Earth Path

The isolators 14*a*, 14*b* also operate, together with the resistor R2, to step down the input voltage and current to a safe level (not detectable by human touch) for supply to the earth conductor 12*c* to confirm there is a connected earth return path. While ever the earth path is connected (and conditions (a) or (b) have not been satisfied), current will flow through the light emitting diode 18, thereby providing a visual indication that there are no faults detected. If, however, there is an open circuit condition (condition (c)), current will flow to the base of the transistor 20 (which in this case takes the form of a Darlington bipolar NPN transistor, though any suitable transistor which operates as a current controlled switch may be utilised) thereby turning on the transistor 20 which in turn causes the light emitting diode 18 to turn off, thereby indicating to a user that there is an open circuit (i.e. un-safe) fault condition. It will be understood that r1 is operable to reduce the supply current to isolator 14*a* and LED 18. Further, it will be understood that any desired form of isolating SSR could be used for achieving the afore described step down and isolating functions. According to the illustrated embodiment, a stepped down voltage of 3.7 volts and a current of less than 1 mA is delivered to the earth conductor 12*c* to confirm its integrity, though it will be understood that the voltage applied to the earth circuit is fully adjustable depending on the desired implementation (readily set by choosing the isolator and various circuit component values, as will be understood by persons skilled in the art).

Test Mechanism

According to the FIG. 1 embodiment, the circuit 10 employs a test mechanism for allowing a user to test whether the safety device is operational (i.e. capable of detecting the various fault conditions). The test mechanism takes the form of a normally closed magnetic reed switch which is electrically connected between the cathode of the first optocoupler 14*a* and the anode of the second optocoupler 14*b*. To test operation, a user places a magnet in proximity to the circuit 10. When the circuit 10 is operational, the LED 18 will extinguish indicating that the circuit 10 is operational. If the LED 18 does not extinguish, then the circuit 10 is not operational.

Reverse Voltage and Mass Fault Protection

As shown in FIG. 1, the circuit 10 employs various semiconductor diodes D1 to D3 which function to provide reverse voltage protection to the internal circuit componentry. The circuit 10 also employs current limiting fuses F1, F2 connected to the active and neutral conductors 12*a*, 12*c*, respectively. The fuses F1, F2 are operable to immediately self-destruct in the event of a surge to prevent dangerous surge current entering the circuit 10. Finally, resistors r4 and r5 are fail safe resistors which have a low wattage rating and "burn out" in response to encountering a mass failure. These resistors may also have a value that is set to reduce the voltage/current that is supplied to the LED 18, isolators 14*a*, 14*b* and earth path, depending on the desired implementation.

The following is a list of components for the parts shown in embodiment FIG. 1, suitable for connecting to a 240V AC Power Supply:

2×4-pin phototransistor opto-isolator (14*a*, 14*b*)
Magnetic reed switch (16)
Green SiC LED 80 mcd (18)
A darlington bipolar NPN transistor (20, Q1)
1000 Volt 1 Amp Diode (D1, D2, D3)
2×50 Milliamp Fuses (F1, F2)
100 K ohm resistor (R1)
10 M ohm resistor (R2)
500 K ohm resistor (R3)
0 ohm resistor (R4, R5)

It will be understood that the component values listed above may vary, depending on the input AC supply voltage, and the desired circuit operation. For example, resistors R4 and R5 may take on a non zero value depending on the current sensing transistor 20 employed by the circuit 10.

In an alternative embodiment, the LED may be supplemented or replaced by an indicator operable to output an audible and/or tactile signal when there is no connected earth path. In yet another embodiment, the LED 18 or an additional LED may be operational with a different colour when there is no earth path connected.

Figure 2:
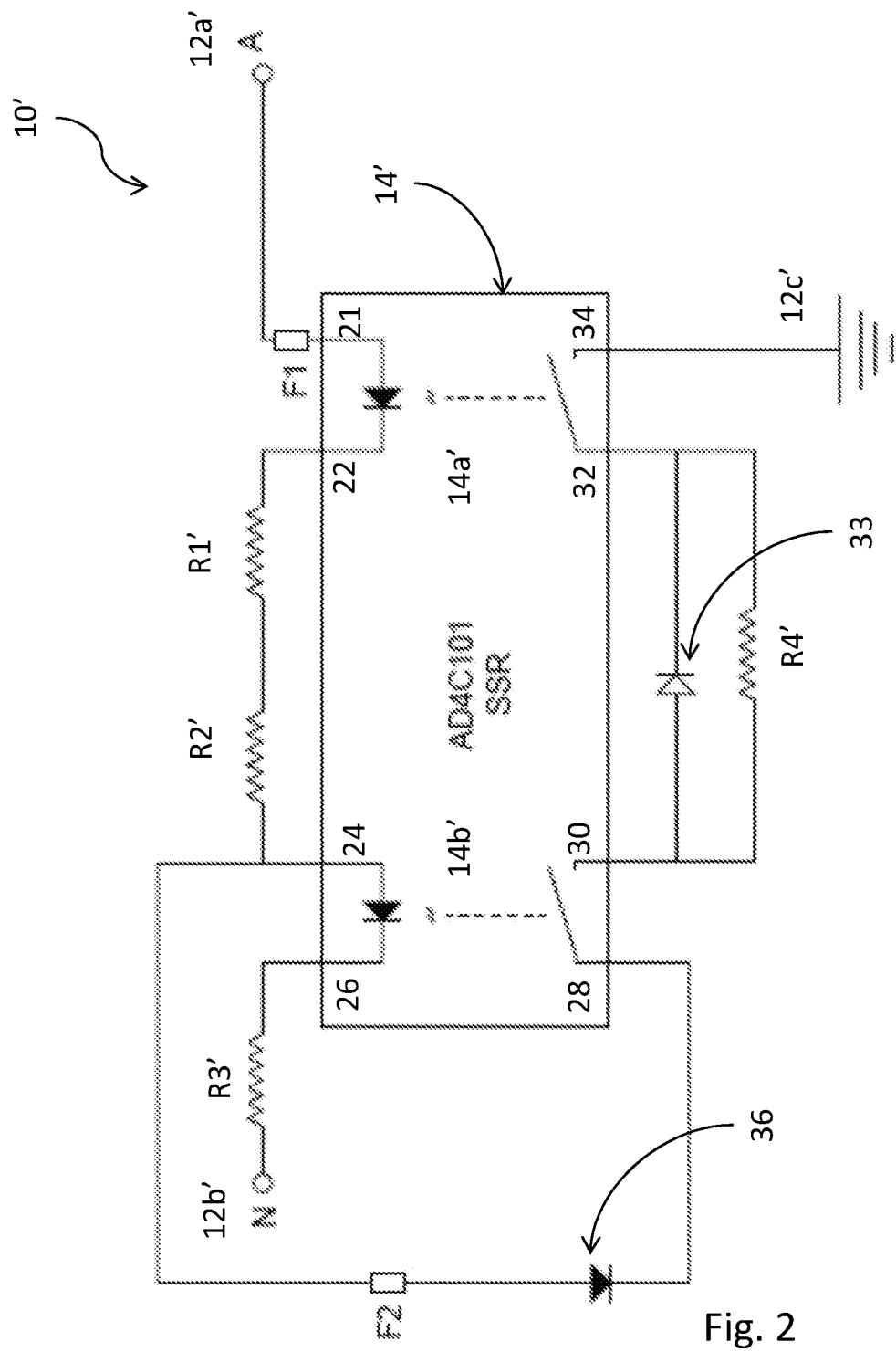
FIG. 2 is a circuit diagram for a safety device circuit, in accordance with an alternative embodiment of the present invention.

An alternative circuit 10' for a safety device is shown in FIG. 2. In this embodiment, the circuit 10' is operable to output an indication while ever an earth path having less than some predefined minimum resistance is detected. According to the illustrated embodiment, a stepped down voltage of 3.7 volts and a current of less than 1 mA is delivered to the earth conductor 12*c*' to confirm its integrity, though, again, it will be understood that the voltage applied to the earth circuit is fully adjustable depending on the desired implementation.

According to the FIG. 2 embodiment, the signal output by the circuit 10' is a visible signal emitted by an LED 33. It will be understood, however, that other types of signal may equally be emitted by the circuit 10', depending only on the desired implementation. For example, the signal may be an audible signal, a tactile signal (e.g. a vibration) or a combination of different desired signals.

Again, a solid state relay 14' is employed to produce the stepped down voltage. According to the illustrated embodiment, the solid state relay 14 takes the form a double pole solid state relay (SSR) employing LED opto-coupler switching. The SSR 14' may, for example, be an AD4C101 manufactured by solid state electronics (see URL: http://http://www.ssousa.com/PDF/AD4C101.pdf). The stepped down voltage and current is set by using parallel and series shunt resistor circuits connected to the SSR 14', as shown in FIG. 2. The circuit 10' comprises a parallel resistor circuit between the active and neutral conductors for connection to the SSR 14' and a series shunt circuit at the SSR 14' load outputs (i.e. connected to LED), so as to produce the stepped down voltage. The following is a list of components for the parts shown in FIG. 1:

1×AD4C101 RCD (14')
Green LED 80 mcd (33)
1000 Volt 1 Amp Diode (36)
2×0.6 watt 75 K ohm Resistor (R1', R2')
0.6 watt 0.5 K ohm Resistor (R3')
0.5 watt 100 K ohm Resistor (R4')
2×2 mA 250 v PCB Fuses (F1', F2')

In more detail, a positive input 21 of a first pole 14*a*' is electrically coupled to the active conductor 12*a*'. A negative input 22 of the first pole 14*a*' is electrically coupled to both a positive input 24 of the second pole 14*b*' and a negative load output 28 of the second pole 16*b*. A negative input 26 of the second pole 14*b*' is electrically coupled to the neutral conductor 12*b*'. A positive load output 30 of the second pole 14*b*' is electrically connected to a negative load output 32 of the first pole 16*a*. Finally, a positive load output 32 of the first pole 14*a*' is electrically connected to the earth conductor 12*c*', i.e. such that the switches of the SSR 14', and thus the signal output by the circuit 10', are only operable when the active and neutral conductors are correctly aligned in the power supply. Furthermore, by virtue of the SSR 14' being positioned within the circuit in the illustrated manner, the circuit 10' can be readily configured to output the signal for any desired minimum resistance. In this instance the size of R3' determines the earth path cut out resistance, while R1' and R2' determine the maximum allowable current which can flow in the earth path or power supply. R1' and R2' provide short circuit protection for any active to neutral faults that may occur on the low voltage output that would be supplied to items in the field when the circuit 10' is used as a power supply, as described in more detail in subsequent paragraphs.

Figure 3:
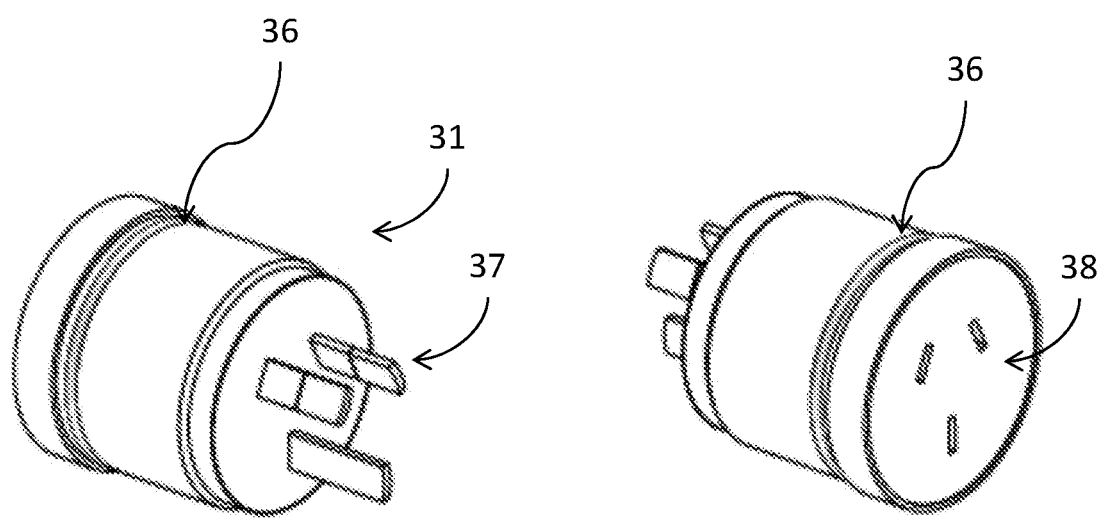
FIG. 3 is a schematic of a safety plug, in accordance with an embodiment.

A particular advantage arising through use of solid state relays in the afore described circuits 10, 10' is that no capacitors or transformers are required for achieving the stepped down voltage and isolation functions. This allows for a circuit that can be installed in a wider range of appliances than conventional safety devices, due to its sub miniature size. Further, the circuit 10, 10' do not disrupt any protection monitoring or testing and tagging procedures that are carried out on those appliances. For example, the circuit 10 may be incorporated/integrated in the following non-limiting list of appliances/devices:

Extension lead plugs and sockets;
Power boards and adaptors;
Power outlets;
Power tools;
Power inlets;
Circuit breakers and meter boards;
Motor homes;
Stand-alone testing devices;
Marine and caravan pillar boxes
Welders
Generators
Pool/spa and water reticulation equipment
Commercial kitchen appliances
Mine site appliances
Workshop machinery and hospitals
Building sites With reference to FIG. 3 there is shown a schematic of an example test device 31 incorporating either of the circuits 10, 10' as described herein. As shown, the device 31 includes a combination of sockets 38 and pins 37 for connecting to any power supply or lead. An LED 18/33 connected to the circuit 10, 10' is mounted within the housing and, when operational, illuminates a ring 36 disposed around an outer wall of the device. It will be understood that the illumination may be provided using any suitable configuration and not limited to a ring as shown in FIG. 3 (e.g. it could simply take the form of a LED or the like projecting out of the device). In this example, the device 31 is formed of a suitable plastic that complies with the relevant regulations for the jurisdiction in which it is sold.

Figure 4:
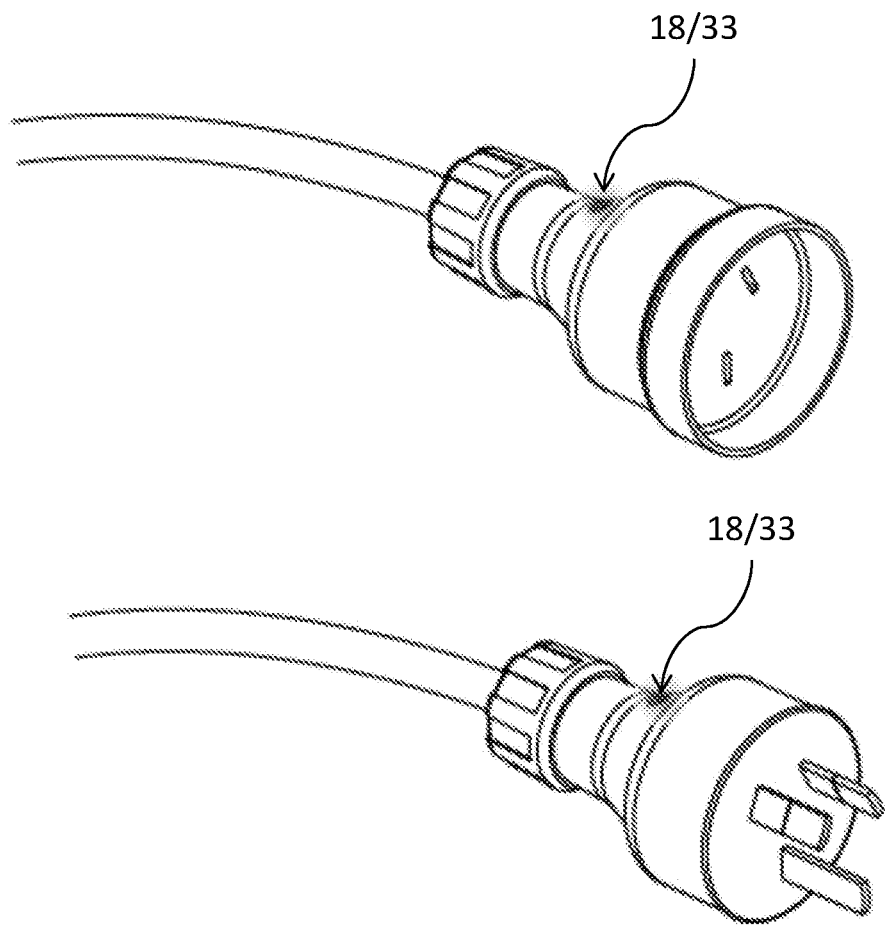
FIG. 4 is a schematic of a safety plug, in accordance with an alternative embodiment.

An alternative device is shown in FIG. 4, whereby the device takes the form of a plug on the end of an extension lead (both a socket and plug end of the lead are shown). In this case the LED 33 is externally visible and again used to provide a visual indication of whether a connected power supply is safe to use.

As mentioned above, either circuit 10, 10' could be installed into RCD's for mobile items, such as caravans. If the circuit 10, 10' detects an open earth path it may be configured to trigger the RCD to trip. According to such an embodiment, the earth leg of the circuit 10, 10' may connect directly to metal framework of the mobile item, thus allowing the RCD to prevent power from being applied to a circuit that does not have a functioning earth path.

Figure 5:
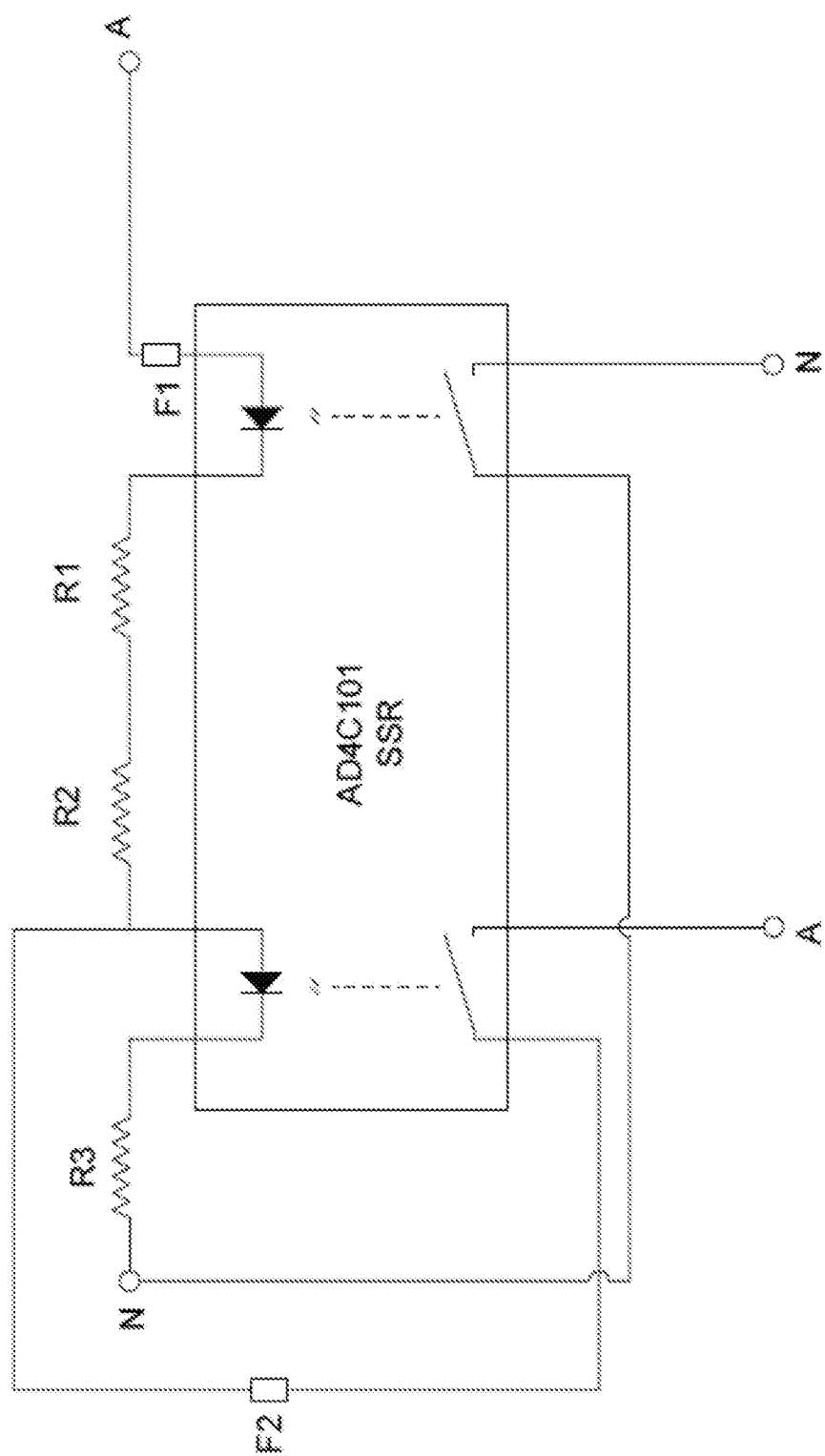
FIG. 5 is a circuit diagram for a safety step power supply circuit, in accordance with an embodiment.

In an embodiment the circuit 10' may be used to supply a stepped down voltage to peripheral equipment. Such a circuit arrangement is shown in FIG. 5. When the circuit 10' is used as a step down power supply, the SSR provides double pole switching protection. The values of the circuit 10' shown in FIG. 5 are the same as for FIG. 2, thereby providing a stepped down voltage of 3.7V suitable for powering devices such as mobile phones and the like. It will be understood, however, that the values could be readily adjusted to provide alternative stepped down voltages, depending only on the desired implementation.

In a particular embodiment, either circuit 10, 10' may be made into a one piece integrated circuit chip. The circuits 10, 10' may, for example, be used to power USB outlets where space constraints prevent the use of a transformer. Miniature items such as USB outlets and surveillance equipment could be housed, powered and contained inside of items such as power plugs.

According to embodiments described herein, the visual fault free indication may make pre-start inspections more efficient and reliable with the added advantage that an untrained person can visually see if the power supply they have plugged into has an operational earth path and that the polarity is correct. It will be understood that the circuits 10, 10' can be adjusted to operate off varied supply voltages and also 3 phase power.

Additional components may be added to the circuit 10 to allow altered outputs and functions. Non limiting examples include:

Additional illumination components and altered colouring;
Power interlocking devices;
Increased voltage/current limitation/regulation
Earth voltage and current altered values for specific illumination requirements;
Altered illumination cut off apparatus for varied earth switching levels.

In addition, although the invention has been described with reference to the present embodiments, it will be understood by those skilled in the art that alterations, changes and improvements may be made and equivalents may be substituted for the elements thereof and steps thereof without departing from the scope of the invention. Further, many modifications may be made to adapt the invention to a particular situation without departing from the central scope thereof. Such alterations, changes, modifications and improvements, though not expressly described above, are nevertheless intended and implied to be within the scope and spirit of the invention. The above described embodiments are therefore not to be taken as being limiting in any respects.

Any reference to prior art contained herein is not to be taken as an admission that the information is common general knowledge of the skilled addressee in Australia or elsewhere.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A safety device for an electrical apparatus powered by an AC mains power supply having a neutral circuit and an active circuit, the safety device comprising an electrical circuit having active, neutral, and earth terminals for connecting to respective active, neutral, and earth conductors of the electrical apparatus, wherein the electrical circuit comprises:
   first and second optocouplers; and
   a bipolar transistor,
wherein:
   an anode of the first optocoupler is electrically connected to the active terminal via a first electrical pathway;
   a collector of the first optocoupler is electrically connected to the active terminal via a second electrical pathway;
   a cathode of the first optocoupler is electrically connected to an anode of the second optocoupler via a light emitting diode (LED);
   an emitter of the first optocoupler is electrically connected to a collector of the second optocoupler;
   a cathode of the second optocoupler is electrically connected to the neutral terminal;
   an emitter of the second optocoupler is electrically connected to the earth terminal;
   a base of the bipolar transistor is electrically connected to the first electrical pathway;
   a collector of the bipolar transistor is electrically connected to an anode of the LED; and
   an emitter of the bipolar transistor is electrically connected to a cathode of the LED,
and wherein:
   in response to (a) the active conductor being wired to the neutral circuit of the AC mains power supply, (b) the neutral conductor being wired to the active circuit of the AC mains power supply, or (c) the neutral conductor being disconnected from the AC mains power supply, the first and second optocouplers are configured to electrically isolate the active terminal and the neutral terminal from the earth terminal by (i) switching off, or (ii) failing to switch on, and
   the bipolar transistor is configured to switch on in response to the first and second optocouplers switching off or failing to switch on, thereby preventing the LED from illuminating to provide a visual indication of a wiring fault.

2. The safety device in accordance with claim 1, wherein the electrical circuit is integrated into the electrical apparatus.

3. The safety device in accordance with claim 2, wherein the LED is visible externally of a housing of the electrical apparatus.

4. The safety device in accordance with claim 1, wherein the first and second optocouplers are miniature optocouplers.

5. The safety device in accordance with claim 1, wherein in response to the active, neutral, and earth terminals being correctly wired to the AC mains power supply:
   the first and second optocouplers are configured switch on, thereby establishing a parallel active to earth circuit and active to neutral circuit, and
   the bipolar transistor is configured to switch off in response to the first and second optocouplers switching on, thereby resulting in the LED turning on, thereby indicating that the active, neutral, and earth terminals are correctly wired to the AC mains power supply.

6. The safety device in accordance with claim 1, wherein the electrical circuit further comprises a resistor network electrically disposed between the active and earth terminals, wherein the resistor network is configured to produce a reduced voltage and current when compared to a voltage and current of the AC mains power supply.

7. The safety device in accordance with claim 1, wherein the electrical circuit further comprises a magnetically controlled switch electrically disposed between the emitter of the first optocoupler and the collector of the second optocoupler, and wherein the magnetically controlled switch is configured to switch from a closed state in an absence of a magnetic field to an open state in response to a magnet in proximity to the magnetically controlled switch, thereby electrically isolating the active and earth terminals, causing the bipolar transistor to switch on, and preventing the LED from illuminating.

8. A safety device for connecting to an AC mains power supply, the safety device comprising:
   an electrical circuit having active, neutral, and earth terminals for connecting to respective active, neutral, and earth conductors of the AC mains power supply, the electrical circuit comprising:
      first and second optocouplers; and
      a bipolar transistor,
   wherein:
      an anode of the first optocoupler is electrically connected to the active terminal via a first electrical pathway;
      a collector of the first optocoupler is electrically connected to the active terminal via a second electrical pathway;
      a cathode of the first optocoupler is electrically connected to an anode of the second optocoupler via a light emitting diode (LED);
      an emitter of the first optocoupler is electrically connected to a collector of the second optocoupler;
      a cathode of the second optocoupler is electrically connected to the neutral terminal;
      an emitter of the second optocoupler is electrically connected to the earth terminal;
      a base of the bipolar transistor is electrically connected to the first electrical pathway;
      a collector of the bipolar transistor is electrically connected to an anode of the LED; and
      an emitter of the bipolar transistor is electrically connected to a cathode of the LED,
   and wherein:
      in response to (a) the active conductor being wired to a neutral circuit of the AC mains power supply, (b) the neutral conductor being wired to an active circuit of the AC mains power supply, or (c) the neutral conductor being disconnected from the AC mains power supply, the first and second optocouplers are configured to (i) switch off, or (ii) fail to switch on,
      the bipolar transistor is configured to switch on in response to the first and second optocouplers switching off or failing to switch on, thereby preventing the LED from illuminating to provide a visual indication of a wiring fault, and
      the bipolar transistor is configured to switch off or remain off in response to the first and second optocouplers switching on or remaining on, thereby causing the LED to illuminate to provide a visual signal that there is no wiring fault and that there is a connected earth return path.

9. The safety device in accordance with claim 8, further comprising a body for at least partially housing the electrical circuit, and wherein the body includes at least one of:

a set of pins electrically connected to respective terminals of the electrical circuit, the pins being suitably configured for connecting to a power outlet which is in turn connected to the AC mains power supply; or a set of sockets electrically connected to the respective terminals of the electrical circuit, the sockets being configured for receiving a plug which is in turn connected to the AC mains power supply.

10. A male or female plug of a power lead, comprising:

the safety device in accordance with claim 8, wherein the LED is disposed on or in a body of the plug.

11. A power board comprising:

the safety device in accordance with claim 8, wherein the LED is disposed on or in a body of the power board.

12. A residual current device comprising:

the safety device in accordance with claim 8, wherein the earth conductor is operable to connect to a grounding framework for the residual current device; and wherein the LED is disposed on or in a body of the residual current device, and wherein the electrical circuit is further configured to trip the residual current device in response to detecting there is no operational earth path.

13. The safety device in accordance with claim 8, wherein the electrical circuit further comprises a magnetically controlled switch electrically disposed between the emitter of the first optocoupler and the collector of the second optocoupler, and wherein the magnetically controlled switch is configured to switch from a closed state in an absence of a magnetic field to an open state in response to a magnet in proximity to the magnetically controlled switch, thereby electrically isolating the active and earth terminals, causing the bipolar transistor to switch on, and preventing the LED from illuminating.

* * * * *